United States Patent
Gulvin et al.

(10) Patent No.: US 7,718,458 B2
(45) Date of Patent: May 18, 2010

(54) ELECTRIC FIELD CONCENTRATION MINIMIZATION FOR MEMS

(75) Inventors: Peter M. Gulvin, Webster, NY (US); Donald J. Drake, Rochester, NY (US)

(73) Assignee: Xerox Corporation, Norwalk, CT (US)

( * ) Notice: Subject to any disclaimer, the term of this patent is extended or adjusted under 35 U.S.C. 154(b) by 66 days.

(21) Appl. No.: 11/853,469

(22) Filed: Sep. 11, 2007

(65) Prior Publication Data
US 2009/0065881 A1    Mar. 12, 2009

(51) Int. Cl.
*H01L 21/00* (2006.01)
*H01L 31/00* (2006.01)
*H01G 5/16* (2006.01)

(52) U.S. Cl. ............... 438/52; 257/420; 361/290

(58) Field of Classification Search ........... 438/57, 438/393, 396, 52; 257/532, 420; 361/290
See application file for complete search history.

(56) References Cited

U.S. PATENT DOCUMENTS

| | | | | |
|---|---|---|---|---|
| 2002/0055268 A1* | 5/2002 | Yu et al. | ...... | 438/759 |
| 2004/0180465 A1* | 9/2004 | Musolf et al. | ...... | 438/52 |
| 2005/0249966 A1* | 11/2005 | Tung et al. | ...... | 428/622 |
| 2006/0291135 A1* | 12/2006 | Musalem et al. | ...... | 361/283.4 |
| 2009/0065881 A1* | 3/2009 | Gulvin et al. | ...... | 257/414 |

* cited by examiner

*Primary Examiner*—Kiesha R Bryant
*Assistant Examiner*—Mark W Tornow
(74) *Attorney, Agent, or Firm*—MH2 Technology Law Group LLP

(57) ABSTRACT

A method and resulting device for reducing an electrical field at an isolation gap in a capacitive actuator includes providing a bottom electrode layer and forming a pattern in the bottom electrode layer having an isolation gap between center and outer electrode components of the patterned electrode. A spacing material is deposited in the isolation gap, the spacing material having a greater height than a remainder of the patterned electrode, and a sacrificial material is deposited conformably on a surface of the patterned electrode and spacing material. The method also includes applying a deformable electrode to a surface of the sacrificial material, whereby removal of the sacrificial and spacing materials results in a greater spacing between the deformable electrode and the electrode layer at a region of the isolation gap than over a remainder of the spacing between the patterned electrode layer and deformable surface.

16 Claims, 7 Drawing Sheets

ELECTRIC FIELD CONCENTRATION MINIMIZATION FOR MEMS

FIELD OF THE INVENTION

The present invention generally relates to minimizing electric field concentration in an electrostatically actuated device, and more specifically to increasing a local gap at select positions between opposing electrode surfaces relative to a local gap between a remainder of opposing electrode surfaces.

BACKGROUND OF THE INVENTION

In the field of electrostatic actuators, a device can be formed of repeating layers of structural, sacrificial, and dielectric materials which are patterned and stacked to form complex three dimensional structures. Electrostatic actuators can typically include a lower electrode opposed by a deformable upper electrode. In order to arrive at such a structure, the lower electrode can be patterned to include isolation gaps between adjacent electrode structures. A sacrificial material can be layered on the lower patterned electrode prior to depositing the upper deformable electrode.

It is a problem in the art, however, that the sacrificial material flows into and conforms to a surface variation of the isolation gaps or "cuts" in the electrode. When the upper electrode is deposited, the surface variation mimics that of the sacrificial material and in some instances can even become exaggerated. The flowing of the sacrificial material into the isolation gaps therefore causes a gap between the spaced electrodes to have a smaller distance therebetween at the location of the isolation gap. This coupled with a known field concentration at the corner of the cut in the electrode, combine to make the location a very likely target for air breakdown, killing the device, or at least changing its behavior over time. In addition, the corners can cause problems in subsequent depositions. For example, a lip can form in a subsequent layer on a high end of the cut, the lip increasing in size over multiple depositions. When the top electrode is deposited, it fills these cracks and results in very sharp protrusions, which resemble stalactites. It is these "stalactites" which can short the device, causing premature breakdown or at least changing device behavior over time.

Current solutions to the problem include chemically mechanically polishing (CMP) any excess of the deposited sacrificial material, thereby filling holes in the bottom film and eliminating the topography of the sacrificial material. However, CMP is an expensive and potentially dirty process. Accordingly, alternatives to CMP are sought.

Thus, there is a need to overcome these and other problems of the prior art and to provide a method and apparatus for minimizing electric field concentration in MEMS devices, particularly at an edge of an isolation gap of a patterned electrode.

SUMMARY OF THE INVENTION

In accordance with the present teachings, a capacitive actuator is provided.

The exemplary device can include a patterned electrode layer, the patterned electrode layer comprising a first portion spaced from adjacent second portions by an isolation gap; and a deformable electrode spaced from the patterned electrode layer by a greater distance at the isolation gap than over a remainder of the patterned electrode layer.

In accordance with the present teachings, a method for reducing an electrical field at an isolation gap in a capacitive actuator is provided.

The exemplary method can include providing a bottom electrode layer; forming a pattern in the bottom electrode layer, the pattern including an isolation gap between a center and outer electrode components of the patterned electrode; depositing a spacing material in the isolation gap, wherein the spacing material has a greater height than a remainder of the patterned electrode; depositing and patterning a sacrificial material over an upper surface of the patterned electrode layer, the sacrificial material conforming to a surface of the patterned electrode and spacing material; and applying a deformable electrode to a surface of the sacrificial material, whereby removal of the sacrificial material and spacing material results in a greater spacing between the deformable electrode and the electrode layer at a region of the isolation gap than over a remainder of the spacing between the patterned electrode layer and deformable surface.

In accordance with the present teachings a method for reducing an electrical field at an isolation gap in a capacitive actuator is provided.

The exemplary method can include providing a bottom electrode layer; forming a pattern in the bottom electrode layer, the pattern including an isolation gap filled with a patterning residue, wherein the patterning residue has a greater height than a remainder of the patterned electrode; depositing a sacrificial material onto a surface of the bottom patterned electrode layer, the sacrificial material conforming to a surface of the patterned electrode and residue; and applying a deformable electrode to a surface of the sacrificial material, whereby removal of the sacrificial material and patterning residue results in a greater spacing between the deformable electrode and the electrode layer at a region of the isolation gap than over a remainder of the patterned electrode layer.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the exemplary embodiments of the invention, examples of which are illustrated in the accompanying drawings. However, one of ordinary skill in the art would readily recognize that the same principles are equally applicable to, and can be implemented in devices other than electrostatic actuator type devices, and that any such variations do not depart from the true spirit and scope of the present invention. Moreover, in the following detailed description, references are made to the accompanying figures, which illustrate specific embodiments. Electrical, mechanical, logical and structural changes may be made to the embodiments without departing from the spirit and scope of the present invention. The following detailed description is, therefore, not to be taken in a limiting sense and the scope of the present invention is defined by the appended claims and their equivalents. Wherever possible, the same reference numbers will be used throughout the drawings to refer to the same or like parts.

Embodiments pertain generally to solutions for reducing or eliminating electric field concentration at isolation gaps as can occur in patterned electrodes of an electrostatic actuator. More specifically, the solutions can be applicable to an electrostatic actuator such as a capacitor with a movable or deformable electrode member.

Figure 1A:
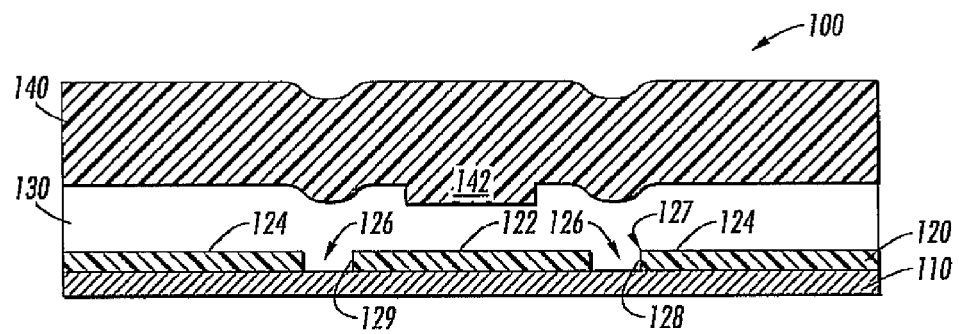
FIGS. 1A and 1B are sectional views of a conventional MEMS device depicting an isolation gap before and after removal of sacrificial material, respectively, in accordance with embodiments of the present teachings.
Figure 1B:
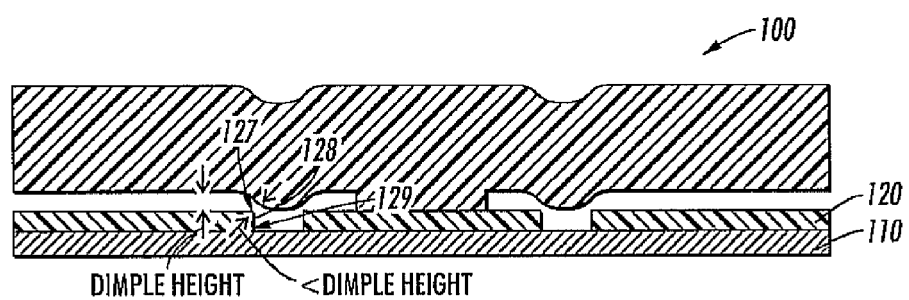

An electrostatic actuator, such as a known MEMS device, is depicted in FIGS. 1A and 1B, with a portion of FIG. 1B exploded to depict a relationship therein. In particular, a typical MEMS device 100 can include a substrate (not shown) with a dielectric spacer 110 thereon. A patterned electrode 120 can be formed on the spacer 110 to include a center electrode 122 isolated from a remainder 124 of the patterned electrode by an isolation gap 126. The center electrode 122 can be grounded as known in the art. The "remainder" 124 of the patterned electrode 120 can also be referred to as the "outer" or "ungrounded" portions of the patterned electrode. The isolation gap 126 can include a step 127, side walls 128, and corners 129. The step 127 can correspond to a transition between an upper surface of the patterned electrode 120 and the side walls 128, while the corner can correspond to a transition between the side walls 128 and dielectric spacer 110.

As depicted in FIG. 1A, a sacrificial material 130 can be deposited over the patterned electrode 120, while a deformable membrane 140 can be deposited over the sacrificial material 130. Removal of the sacrificial material 130 results in the configuration of FIG. 1B whereby a dimple 142 of the deformable membrane 140 can be deformed to contact the isolated center electrode 122 of the patterned electrode 120. The membrane 140 can also be grounded so that when it contacts the center isolated electrode 122, the membrane 140 and the isolated electrode 122 are at the same voltage. Deposition of the sacrificial material 130 and deformable electrode 140 can be in a known manner to achieve the described dimple 142.

In a device such as that depicted in FIGS. 1A and 1B, it will be appreciated that the highest electrical field in the device will occur in areas just on the outer sides of the isolation gap 126. Without undue explanation, it will be appreciated that these highest electrical fields are between the step 127 of the outer electrode 124 and the closest point of the membrane 140 as the membrane moves closer to the step of the outer electrode.

As further depicted in FIGS. 1A and 1B, flowing of the sacrificial material 130 at the step 127 of the isolation gap 126 results in a reduced spacing between the patterned electrode 120 and the deformable electrode 140 at the region of the isolation gap 126. In order to prevent this location from having a higher field than any other location in the MEMS Device 100, a surface of the deformable electrode 140 should not dip below or extend beyond a height of the dimple 142. In combination with the field concentration that occurs at the bottom corners 129 of the isolation gap 126 in the patterned electrode 120, there is a substantial likelihood of air breakdown, shorting, or similar malfunctions, which can reduce effectiveness and/or change the behavior of the device over time, or destroy it entirely.

In the case of multiple subsequent depositions on the patterned electrode 120, the corners 129 of the isolation gap 126 can cause even further problems. For example, a lip can form in subsequent layers on the step 127 end of the side wall 128, which becomes exaggerated as the deposition becomes thicker. When the deformable electrode 140 is deposited over the sacrificial material 130, it fills these cracks, resulting in sharp protrusions resembling stalactites. The protrusions can, at a minimum, act as a concentrated point for breakdown, or cause a short of the device entirely.

Figure 2A:
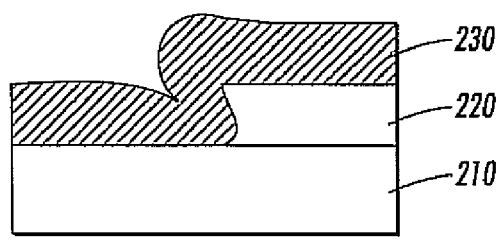
FIGS. 2A, 2B and 2C are side sectional views depicting known examples of non-conformal coatings in accordance with embodiments of the present teachings.
Figure 2B:
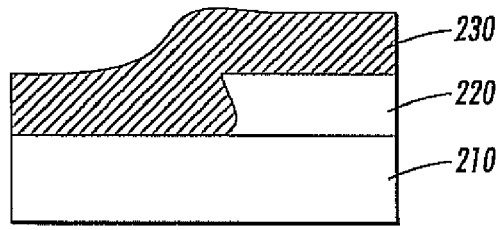
Figure 2C:
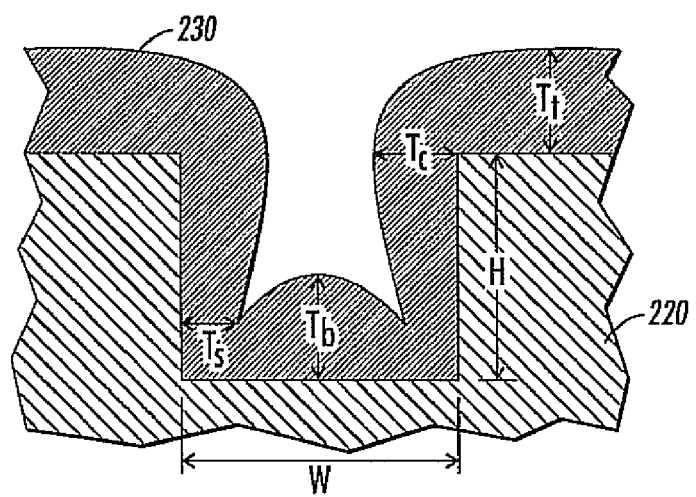

Examples of profiles resulting from layers deposited at the step 127 and/or isolation gap 126 of the patterned electrode 120 are illustrated in FIGS. 2A, 2B and 2C. In particular, the deposited conformal layer 230 depicted in the examples can include a doped oxide such as phosphosilicate glass (PSG). The PSG layer can then act as a "mold" to shape a subsequently deposited layer. This creates the downward spikes of material described as "stalactites" above. In some cases, the stalactite shaped material can extend to the patterned electrode 220 and short the device. In other cases, even a small lip can touch and short when very little voltage is applied. Even if the stalactite shaped material is very small, the stalactite can still affect robustness of the device by acting as field concentration points, lowering the voltage at which the formed device suffers from dielectric breakdown.

Figure 3A:
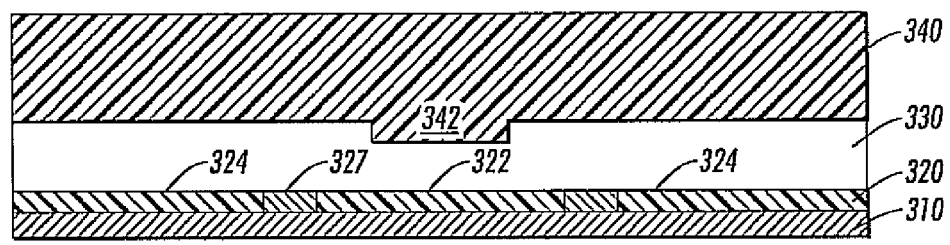
FIGS. 3A and 3B are side sectional views illustrating a conventional solution to correcting non-conformal coatings in accordance with embodiments of the present teachings.
Figure 3B:
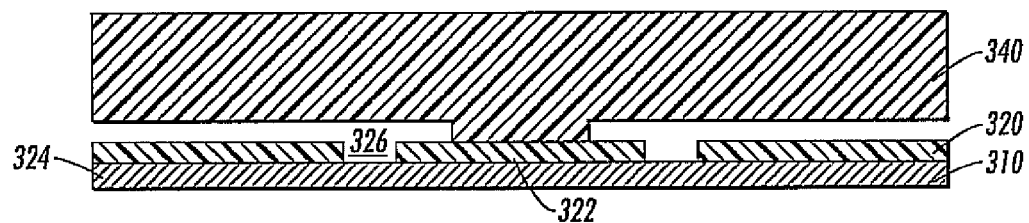

FIGS. 3A and 3B are side views depicting a known solution for "planarizing" a sacrificial material 330 prior to depositing a deformable electrode 340. Specifically, a substrate 310 supports a patterned electrode 320 thereon, the patterned electrode including the grounded center electrode 322 and outer electrode portions 324 spaced by a patterned isolation gap 326. The isolation gap 326 can be formed as a result of an etching, and a residue or filler 327 can remain therein, polished until its top surface is flat, potentially removing all sacrificial material 330 except that which remains in the isolation gap 330. The oxide 327 remaining in the isolation gap 326 can create a totally planar surface so that the electrode cut has no effect on the membrane 340 above. Deposition of the sacrificial material 330 is followed by chemical mechanical polishing (CMP) of excess sacrificial material. Additional sacrificial material 330 can optionally be deposited, particularly in cases where the polishing has removed all sacrificial material 330 except that which remains in the isolation gap 330. The deformable electrode 340 is then formed on a planarized surface and remains uniformly spaced from a patterned electrode 320 upon removal of the sacrificial material 330. The deformable electrode 340 can include a dimple 342 as known in the art. However, the invention alone has appreciated that CMP is an expensive and potentially dirty process, particularly when used in connection with the known device of FIGS. 3A and 3B. Accordingly, the present invention provides improved alternatives to the CMP solution.

Figure 4A:
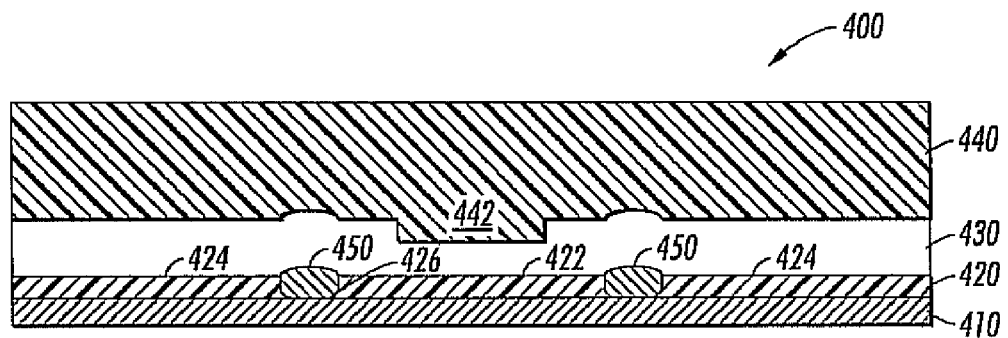
FIGS. 4A and 4B are side sectional views of a fabricated device for use with embodiments of the present teachings.
Figure 4B:
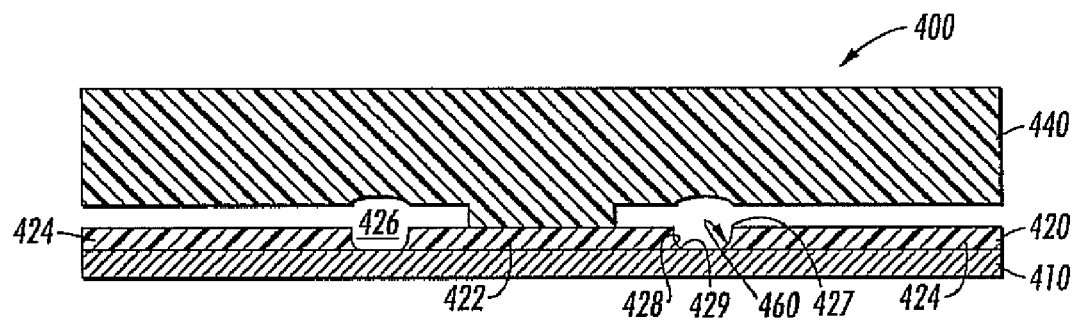

Turning now to FIGS. 4A and 4B, a first exemplary approach is described. In the exemplary embodiment, a bottom electrode is patterned by oxidation rather than etching and CMP as occurs in the art.

The structural device 400 of FIGS. 4A and 4B can include an insulating layer 410 supported on a substrate (not shown), a patterned electrode 420 formed on the grounded electrode, and a deformable electrode 440 opposing the patterned electrode. At an intermediate formation of the device 400, each of an oxide growth 450 and a sacrificial material 430 can be positioned between the patterned electrode 420 and the deformable electrode 440 (see FIG. 4A).

The insulating layer 410 can include a nitride material and the patterned electrode 420 can include a polysilicon material having a predefined pattern formed therein. By way of example, the patterned electrode 420 can include a center isolated electrode 422 spaced from adjacent outer electrodes 424 of the pattern by an isolation gap 426. The isolation gap 426 can be formed through the patterned electrode 420 to a depth revealing a surface of the insulating layer 410. The isolation gap 426 can be further characterized as including a step 427, side walls 428, and corners 429. The step 427 can correspond to a transition between an upper surface of the patterned electrode 420 and the side wall 428, while the corner 429 can correspond to a transition between the side wall 428 and the insulating layer 410. It will be appreciated that the terms "step" and "corner" need not assume an angular shape, but can be a curve or other shape.

Patterning of the patterned electrode 420 can be by thermal oxidation, converting portions of the layer to the oxide growth 450 as shown. The portions converted to oxide growth 450 remain in the isolation gaps 426 during subsequent deposition of the sacrificial material 430 and deformable electrode 440 and will be described further in connection with the patterning process.

The deformable upper electrode 440 can include a dimple 442 formed in a surface facing the patterned electrode 420. The deformable upper electrode 440 can be a polysilicon deposited and patterned in a known manner.

In order to define the spacing between the patterned electrode 420 and the deformable electrode 440, the sacrificial material 430, such as phosphosilicate glass (PSG), can be conformally deposited on the patterned electrode 420 prior to depositing the deformable electrode 440. However, the patterning of the patterned electrode 420 creates a characteristic surface upon which the sacrificial material 430 flows as described above. Specifically, absent an intervening aspect such as described herein, the PSG will flow into the isolation gaps 426 and result in the stalactite formations described in connection with the conventional art.

In response to this problem, the patterned electrode 420 herein can include the oxide growth 450 in the isolation gap 426, thus creating a "bump" at that location. The conformal PSG contours to the bump of oxide growth 450, as does the deposited deformable electrode 440. The bump of oxide growth 450 increases a spacing between the isolation gap 426 of the patterned electrode 420 and a corresponding opposing surface of the deformable electrode 440 facing the isolation gap as compared to a remainder of the spacing between the patterned and deformable electrodes, thereby decreasing an electrical field at the region of the isolation gap 426 upon operation of the device. Thus, a predetermined spacing can be maintained between the patterned electrode 420 and deformable electrode 440, even at the isolation gap 426 in the patterned electrode once the sacrificial material is removed.

In order to obtain the described bump of oxide growth 450, the patterned electrode 420 can be patterned by thermal oxidation. The patterned electrode 420 can be a polysilicon electrode. Patterning of the polysilicon electrode by thermal oxidation can convert the desired pattern portion of the electrode to oxide as depicted in FIG. 4A. The oxide growth 450 will be substantially thicker than the silicon which it replaces as a result of the oxidation. In addition, the oxidation process proceeds down and slightly sideways through the polysilicon of the patterned electrode 420, slowing as it goes, stopping only when it hits the underlying insulating layer 410. The oxidation process results in a shallow filleted curvature 460 at the "corner" 429 of the isolation gap where side walls 428 of the isolation gap join with the insulating layer 410. This shallow curvature 460 eliminates sharp corners in the isolation gap 426 of the patterned electrode 420, thereby removing field concentration that can occur in the presence of sharp corners. Even further, since the sacrificial material 430 can not flow to form a "lip" on the steps 427 of the isolation gap 426, the subsequently deposited deformable electrode 440 can not form stalactites within the isolation gap as in prior devices.

Figure 5:
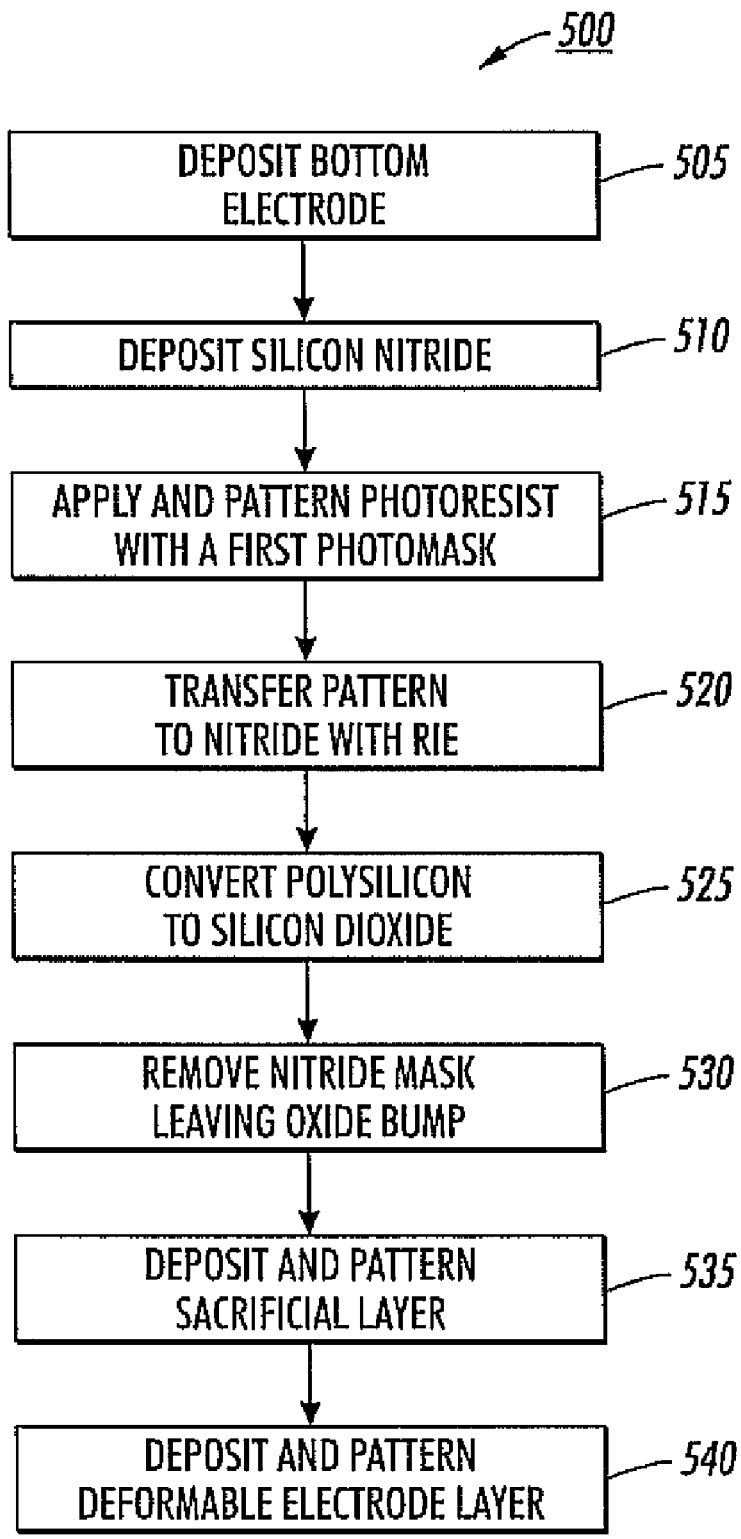
FIG. 5 is a fabrication process for the device illustrated in FIGS. 4A and 4B in accordance with embodiments of the present teachings.

Referring now to FIG. 5, a process 500 for fabricating the device of FIG. 4B will be described. It will be appreciated that while steps are described in an order, certain steps may be added, removed or modified without departing from the scope of the invention.

In general, the polysilicon on the insulating layer 410 is deposited but not etched at step 505. Silicon nitride is deposited, typically in a low-pressure chemical vapor deposition (LPCVD) furnace at step 510. Photoresist is then applied and patterned with a photomask at step 515, and the pattern is transferred to the nitride with a reactive ion etch (RIE) at 520. The wafer is then placed in an oxidation furnace (dry or steam), which converts exposed polysilicon to silicon dioxide at step 525. The oxidation proceeds down and slightly sideways through the polysilicon, slowing as it progresses, and only stopping when it reaches the underlying nitride. For a thin polysilicon layer (for example about 0.3 μm herein), the oxidation can be completed within hours. At step 530, the nitride mask can be removed by wet or dry etch, leaving the bump of oxide growth 450 remaining in the isolation gap 426 of the patterned electrode 420. The rest of the process can proceed in a known manner at step 535, depositing and patterning multiple layers of phosphosilicate glass to build up the dimple and establish a predetermined spacing between the patterned electrode and the deformable electrode, and then depositing and patterning the polysilicon for the deformable electrode layer at step 540.

Figure 6A:
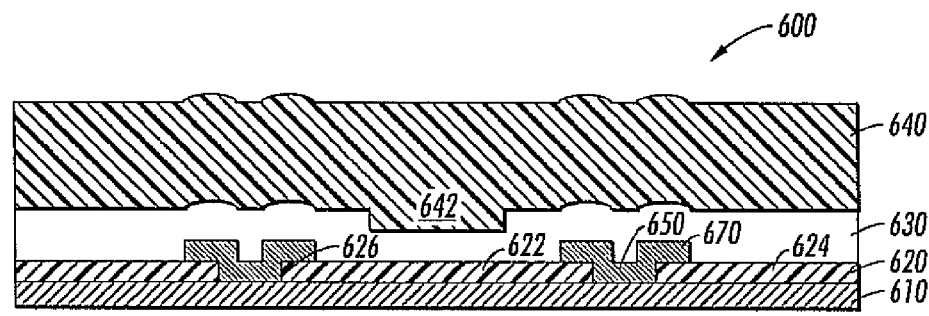
FIGS. 6A and 6B are side sectional views of a fabricated device for use with embodiments of the present teachings.
Figure 6B:
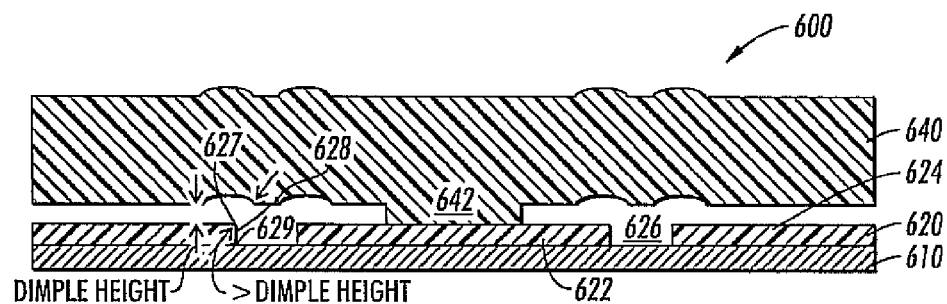

Turning now to FIGS. 6A and 6B, an alternative exemplary approach to reducing or eliminating electric field concentration is shown. The alternative approach can include an additional or extra sacrificial material over steps of an isolation gap as will be further described in the following.

Initially, FIGS. 6A and 6B can include an insulating layer 610 supported on a substrate (not shown), a patterned electrode 620 formed on the insulating layer, and a deformable electrode 640 opposing the patterned electrode.

The insulating layer 610 can include a nitride material and the patterned electrode 620 can include a polysilicon material having a predefined pattern therein. By way of example, the patterned electrode 620 can include a center isolated electrode 622 spaced from adjacent outer electrodes 624 of the pattern by an isolation gap 626. The isolation gap 626 can be formed through the patterned electrode 620 to a depth revealing a surface of the insulating layer 610. The isolation gap 626 can be further characterized as including a step 627, side walls 628, and corners 629. The step 627 can correspond to a transition between an upper surface of the patterned electrode 620 and the side wall 628, while the corner 629 can correspond to a transition between side walls 628 and the insulating layer 610. It will be appreciated that the terms "step" and "corner" need not assume an angular shape, but could be a curve or other shape.

Patterning of the patterned electrode 620 can be by etching.

The deformable upper electrode 640 can include a dimple 642 formed in a surface facing the patterned electrode 620. The dimple 642 can have a defined height as known in the art. The deformable upper electrode 640 can be a polysilicon material deposited and patterned in a known manner. An etch of the dimple can be accomplished by depositing a layer of oxide equal to a desired dimple height, followed by etching of the dimple. Then, another layer of oxide is deposited to reach a desired total oxide thickness, followed by an anchor etch. An advantage of this process is that it corresponds to a thickness of the first layer of oxide, yielding extremely accurate dimple formation.

During formation of the device 600, spacing materials 650, 670 can be deposited and/or formed in and around the isolation gap 626 of the patterned electrode 620 and a sacrificial material 630 can be formed over the spacing materials. With such an arrangement, the deformable electrode 640 can be spaced from the patterned electrode 620 by a greater distance at the isolation gap 626 than over a remainder of the patterned electrode 620. As described in connection with the exemplary embodiment of FIGS. 4A and 4B, the intervening spacing materials 650, 670 can create a surface in combination with the patterned electrode 620 which prevents the sacrificial material 630 from flowing into the isolation gap 626 when the sacrificial material is in a flowable state.

The spacer materials can include a first material 650 deposited in the isolation gap, for example oxide or nitride, and an intermediate layer 670 of sacrificial material over the first material 650. In particular, the intermediate layer 670 of sacrificial material can be deposited over the first material 650, and to a position overlapping the steps 627 of the isolation gap 626. The spacer materials 650, 670 combine to form a "bump" at a location of the isolation gap 626. The conformal sacrificial material 630 contours to the "bump", as does the deposited deformable electrode 640. The "bump" increases a spacing between the isolation gap 626 of the patterned electrode 620 and a corresponding opposing surface of the deformable electrode 640 facing the isolation gap as compared to a remainder of the spacing between the patterned and deformable electrodes, thereby decreasing an electrical field at the region of the isolation gap of the device.

Still further, the first spacing material 650 can be formed by depositing an oxide, sacrificial material or the like in the isolation gap. Other depositions and patterning techniques are not intended to be excluded from the instant disclosure The additional intermediate spacing material 670 can be patterned and/or deposited in addition to the first spacing material 650. The purpose of the additional spacing material 670 is to compensate for possible misaligned of patterns with respect to the isolation gap 626.

The intermediate layer of spacing material 670 increases a distance between the patterned electrode 620 and the subsequently deposited deformable electrode 640 at the location of the isolation gap 626 while allowing for possible misaligned. Similar to the local oxidation process, depositing the extra layer of spacing material 670 eliminates a vulnerable point in the device, namely the step 627 at the edge of the center electrode 622, in a patterned electrode 620 having isolation gaps 626. The additional spacing material 670 can be an oxide, such as PSG or tetraethyl orthosilicate (TEOS), silicon nitride, or any other insulator.

Figure 7:
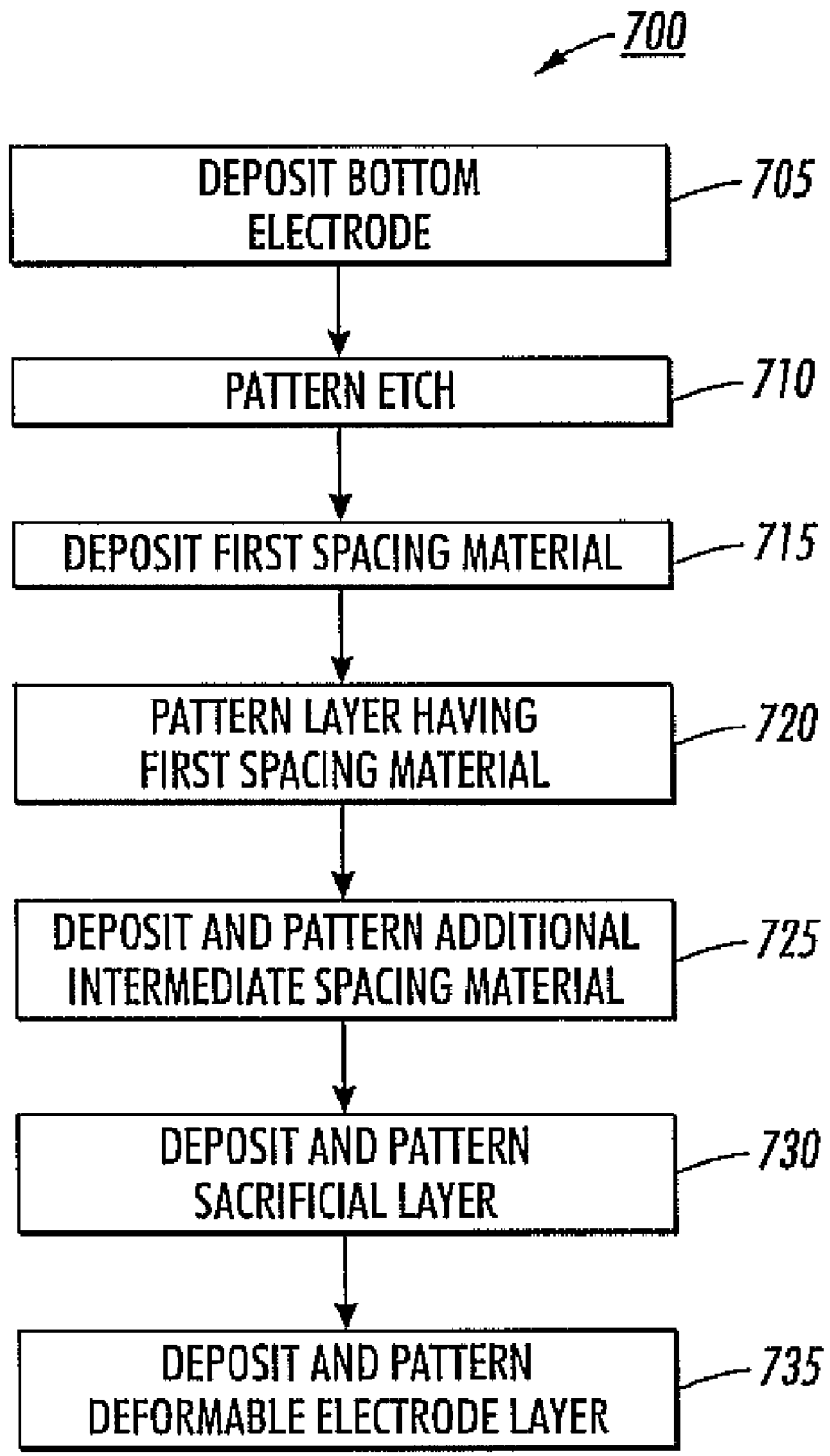
FIG. 7 is a fabrication process for the device illustrated in FIGS. 6A and 6B in accordance with embodiments of the present teachings.

A method of fabricating the device of FIGS. 6A and 6B is described in connection with FIG. 7. It will be appreciated that while steps are described in an order, certain steps may be added, removed or modified without departing from the scope of the invention.

In general, a process 700 for forming the device of FIG. 6B will be described. The polysilicon on the insulating layer 610 is deposited at step 705. An etching process can take place at step 710, forming the bottom electrode pattern within the insulating layer 610. Subsequent to pattering, a first spacing material 650 is deposited into etched isolation gap 626 of the insulating layer at step 715.

Subsequent to depositing the first spacing material 650 in the isolation gap 626, an additional patterning is performed at 720. At 725, an additional spacing material 670 is deposited or applied after patterning layer 620 so that the additional spacing material 670 only remains in areas where there are isolation gaps 626, biased by a few microns (depending upon design rules) to ensure that the isolation gap 626 is covered, even when misaligned. The additional spacing material 670 can be any of an extra layer of oxide or an alternative sacrificial material and can be about 0.3 µm in thickness.

The rest of the process can proceed in a known manner at step 730, depositing and patterning multiple layers of phosphosilicate glass to build up the dimple and predetermined spacing between the patterned electrode and the deformable electrode, and then depositing and patterning the polysilicon for the deformable electrode layer at step 735.

Although the relationships of components are described in general terms, it will be appreciated that one of skill in the art can add, remove, or modify certain components without departing from the scope of the exemplary embodiments.

It will be appreciated by those of skill in the art that several benefits are achieved by the exemplary embodiments described herein and include reduced costs, fewer components, elimination of chemical mechanical polishing, increased accuracy of components, and removal of alignment errors.

While the invention has been illustrated with respect to one or more exemplary embodiments, alterations and/or modifications can be made to the illustrated examples without departing from the spirit and scope of the appended claims. In particular, although the method has been described by examples, the steps of the method may be performed in a different order than illustrated or simultaneously. In addition, while a particular feature of the invention may have been disclosed with respect to only one of several embodiments, such feature may be combined with one or more other features of the other embodiments as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." And as used herein, the term "one or more of" with respect to a listing of items such as, for example, "one or more of A and B," means A alone, B alone, or A and B.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any an all sub-ranges between (and including) the minimum value of zero and the maximum value of 10,that is, any and all sub-ranges having a minimum value of equal to or greater than zero and a maximum value of equal to or less than 10, e.g., 1 to 5.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims and their equivalents.

What is claimed is:

1. A method for reducing an electrical field at an isolation gap in a capacitive actuator, the method comprising:
    providing a bottom electrode layer;
    forming a pattern in the bottom electrode layer, the pattern including an isolation gap between a center and outer electrode components of the patterned electrode layer;
    depositing a spacing material at least in the isolation gap, wherein the spacing material has a greater height than a remainder of the patterned electrode layer;
    depositing and patterning a sacrificial material over an upper surface of the patterned electrode layer, the sacrificial material conforming to a surface of the patterned electrode layer and the spacing material; and
    applying a deformable electrode to a surface of the sacrificial material, wherein the deformable electrode is spaced from the patterned electrode layer a greater distance at a region of the isolation gap than over a remainder between the patterned electrode layer and the deformable electrode resulting from the formation of the spacing material.

2. The method of claim 1, wherein the spacing material is a removable oxide material.

3. The method of claim 1, wherein the spacing material comprises a first spacing material and an additional layer of spacing material, and wherein depositing the spacing material at least in the isolation gap further comprises:
    depositing the first spacing material in the isolation gap and overlying the electrode layer;
    patterning the first spacing material from over the electrode layer; and
    subsequent to patterning the first spacing material, depositing the additional layer of spacing material at the isolation gap over the first spacing material, the additional layer of spacing material overlapping edges of the isolation gap.

4. The method of claim 3, wherein the additional layer of spacing material is about 0.3 μm thick.

5. The method of claim 3, wherein the additional layer of spacing material is deposited to be about 0.3 μm above a surface of the bottom electrode layer.

6. The method of claim 3, wherein the additional layer of spacing material comprises an oxide.

7. The method of claim 1, wherein the sacrificial material comprises phosphosilicate glass (PSG).

8. A method for reducing an electrical field at an isolation gap in a capacitive actuator, the method comprising:
    providing a bottom electrode layer;
    forming a pattern in the bottom electrode layer, the pattern including an isolation gap filled with a spacing material, wherein the spacing material has a greater height than a remainder of the patterned electrode layer and overlaps edges of the isolation gap;
    depositing a sacrificial material onto a surface of the bottom patterned electrode layer, the sacrificial material conforming to a surface of the patterned electrode layer and the spacing material; and
    applying a deformable electrode to a surface of the sacrificial material, wherein the deformable electrode is spaced from the patterned electrode layer a greater distance at a region of the isolation gap than over a remainder of the patterned electrode layer resulting from the formation of the spacing material.

9. The method of claim 8, wherein forming the pattern in the bottom electrode comprises a thermal oxidation process, thereby creating an oxide deposit as the spacing material in the isolation gap.

10. The method of claim 9, further comprising:
    depositing the bottom electrode layer free of etching;
    depositing silicon nitride;
    applying photoresist to the silicon nitride;
    patterning the photoresist with the bottom electrode photomask;
    transferring the pattern to the nitride with a reactive ion etch;
    converting exposed polysilicon at the isolation gap to silicon dioxide in an oxidation furnace;
    removing the nitride mask;
    depositing the sacrificial material to a predetermined height; and
    depositing and patterning the deformable electrode layer.

11. The method of claim 10, wherein depositing silicon nitride comprises depositing in a low pressure chemical vapor deposition furnace.

12. The method of claim 10, wherein the oxidation furnace comprises a dry furnace.

13. The method of claim 10, wherein the oxidation furnace comprises a steam furnace.

14. The method of claim 10, wherein removing the nitride mask is with a wet etch.

15. The method of claim 10, wherein removing the nitride mask is with a dry etch.

16. The method of claim 8, wherein the sacrificial material comprises phosphosilicate glass (PSG).

* * * * *